United States Patent
Wu et al.

(10) Patent No.: US 11,437,792 B2
(45) Date of Patent: Sep. 6, 2022

(54) CABLE MANAGEMENT ASSEMBLY FOR CABLE MANAGER AND CABLE MANAGER

(71) Applicant: CommScope Technologies LLC, Hickory, NC (US)

(72) Inventors: Wenyong Wu, Jiangsu (CN); Jing Wang, Jiangsu (CN); Zhihui Liu, Jiangsu (CN); Danny Ghislain Thijs, Zonhoven (BE)

(73) Assignee: Commscope Technologies LLC, Hickory, NC (US)

( * ) Notice: Subject to any disclaimer, the term of this patent is extended or adjusted under 35 U.S.C. 154(b) by 0 days.

(21) Appl. No.: 17/127,633

(22) Filed: Dec. 18, 2020

(65) Prior Publication Data

US 2021/0194227 A1 Jun. 24, 2021

(30) Foreign Application Priority Data

Dec. 20, 2019 (CN) .......................... 201911324036.4

(51) Int. Cl.
*H02G 3/04* (2006.01)

(52) U.S. Cl.
CPC ................................. *H02G 3/0456* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,009,223 | A * | 12/1999 | Arizpe | G02B 6/4452 385/134 |
| 6,315,249 | B1 * | 11/2001 | Jensen | H05K 7/1491 248/49 |
| 6,381,393 | B1 | 4/2002 | Matthews et al. | |
| 6,600,107 | B1 * | 7/2003 | Wright | H02B 1/202 174/101 |
| 7,348,488 | B2 * | 3/2008 | Benito-Navazo | H02G 3/045 174/68.1 |
| 7,973,242 | B2 * | 7/2011 | Jones | H04Q 1/06 174/100 |
| 8,221,169 | B2 | 7/2012 | Ahmed et al. | |
| 9,212,765 | B1 * | 12/2015 | Chia | H04Q 1/06 |
| 9,548,597 | B2 * | 1/2017 | Vacca | H02G 3/32 |
| 10,141,728 | B1 * | 11/2018 | Valenti | E05D 7/081 |
| 10,444,459 | B2 * | 10/2019 | Haataja | G02B 6/44 |
| 11,202,386 | B2 * | 12/2021 | Hjelmfelt | F16L 3/127 |

(Continued)

FOREIGN PATENT DOCUMENTS

CN 208092276 U 11/2018
WO 2017181334 A1 10/2017

*Primary Examiner* — Monica E Millner
(74) *Attorney, Agent, or Firm* — Merchant & Gould P.C.

(57) ABSTRACT

The present invention relates to a cable management assembly (3) for a cable manager, and a cable manager comprising the same, wherein the cable management assembly comprises a plurality of cable management elements (4) arranged sequentially, at least one of which forms a cable receiving portion (5), in which two adjacent cable management elements are connected to each other through a weak portion (7) which is breakable by rotating the weak portion, so that the two adjacent cable management elements are separated from each other. The cable management assembly may be changed flexibly as necessary in an ex post facto manner.

28 Claims, 2 Drawing Sheets

(56) References Cited

U.S. PATENT DOCUMENTS

| | | | |
|---|---|---|---|
| 2006/0171651 A1* | 8/2006 | Laursen | H04Q 1/064 |
| | | | 385/135 |
| 2010/0252701 A1 | 10/2010 | Vogel et al. | |
| 2016/0061354 A1* | 3/2016 | Abby | B65H 75/446 |
| | | | 211/85.5 |
| 2018/0020569 A1 | 1/2018 | Wang et al. | |

* cited by examiner

CABLE MANAGEMENT ASSEMBLY FOR CABLE MANAGER AND CABLE MANAGER

CROSS-REFERENCE TO RELATED APPLICATION

This application claims the benefit of Chinese Patent Application No. 201911324036.4, filed on Dec. 20, 2019, the disclosure of which is incorporated herein by reference in its entirety.

TECHNICAL FIELD

The present invention relates to the field of cable management, and more particularly to a cable management assembly for a cable manager and a cable manager comprising the cable management assembly.

BACKGROUND

Cable managers are widely applied in cable management. A cable manager typically comprises some cable management assemblies. A cable may be, for example, an electric cable such as a copper cable or an optical cable, or may be a single electric line such as copper line or a fiber optic line. Cables may be managed by a cable manager, for example, the same type or different types of cables may be guided, held and/or grouped sequentially through the cable manager. For example, a cable manager and a cable management assembly for the same are known from US20180020569A1.

In the cable manager known from US20180020569A1, the cable management assembly comprises a plurality of cable management elements adjacent to each other, which are sequentially arranged and connected to each other. In addition, additional finger clips are used in the cable management assembly to prevent the received cables from accidentally sliding out of the respective cable management element.

For other prior arts regarding a cable manager and a cable management assembly thereof, please refer to U.S. Pat. Nos. 6,381,393B1 and 8,221,169B2 for example.

SUMMARY OF INVENTION

An object of the present invention is to provide a cable management assembly for a cable manager, and a cable manager comprising the cable management assembly, wherein the cable management assembly may be changed flexibly as necessary in an ex post facto manner.

According to a first aspect of the present invention, a cable management assembly for a cable manager is provided. The cable management assembly comprises a plurality of cable management elements arranged sequentially, at least one of which forms a cable receiving portion, wherein two adjacent cable management elements are connected to each other through a weak portion which is to breakable by rotating the weak portion, so that the two adjacent cable management elements are separated from each other.

In the cable management assembly, at least one of the cable management elements may be easily separated and removed as necessary, which may be performed before, during or after the cable management assembly is mounted to the cable manager. For example, it is possible that, when the space required by a cable bunch exceeds the space available between two adjacent cable management elements, or when an additional member is obstructed by one of the cable management elements, this cable management element may be separated and removed as needed.

In some embodiments, the weak portion may include a body and at least one tab, wherein the body is connected to the two adjacent cable management elements through the at least one tab. For example, it is possible that, exactly one tab connects the body with the two adjacent cable management elements.

In some embodiments, the weak portion may include a body which is connected to the two adjacent cable management elements in a material-fit manner, and the material-fit connection may be damaged when the body is rotated with a predetermined torque.

In some embodiments, the weak portion may include a first tab and a second tab, wherein the body is connected to one of the two adjacent cable management elements through the first tab, and to the other of the two adjacent cable management elements through the second tab, and at least one of the first tab and the second tab is disconnectable by rotating the body.

In some embodiments, there is a gap between the body and the two adjacent cable management elements, wherein the first tab and the second tab are disposed in the gap.

In some embodiments, two first tabs and two second tabs may be provided in the gap.

In some embodiments, the two first tabs and the two second tabs may be disposed in the gap uniformly in a circumferential direction of the body.

In some embodiments, the body may be constructed as a columnar body.

In some embodiments, the body may be provided with a groove configured to receive a screwing tool. The screwing tool may be, for example, a manual screwdriver, an electric tool, or a polygonal wrench.

In some embodiments, the groove may be constructed as a straight or cross-shaped groove.

In some embodiments, the body may have an outer polygon or an inner polygon configured to receive a corresponding wrench.

In some embodiments, the two adjacent cable management elements may be spaced apart from each other by a distance at their ends facing towards each other.

In some embodiments, every two adjacent cable management elements may be connected to each other through the weak portion.

In some embodiments, every two adjacent cable management elements may form a pair, in which the cable management elements are permanently non-detachably connected to each other, and two adjacent cable management elements in two adjacent pairs may be connected to each other through the weak portion.

In some embodiments, each cable management element may form the cable receiving portion. It is also possible that, only some of the cable management elements form the cable receiving portion.

In some embodiments, at least one of the plurality of cable management elements may have a mounting structure, by means of which the cable management assembly, in particular the at least one of the plurality of cable management elements, can be held.

In some embodiments, each cable management element may have the mounting structure.

In some embodiments, the mounting structure may include a snap-fit element and/or a positioning element. The positioning element may be, for example, a sheet body or a pin-shaped element.

In some embodiments, the mounting structure may be implemented by a bolted connection and/or a clamped connection.

In some embodiments, at least one of the cable management elements, preferably each cable management element, may be constructed as a finger, which includes a rod section and a hook portion.

In some embodiments, a recess may be formed on the back of the finger, and a free end of another finger adjacent to the finger on the back of the finger extends into the area of the recess.

In some embodiments, the hook portion of the finger may be made from a flexible material.

In some embodiments, the cable management assembly may be integrally injection molded.

In some embodiments, the number of the cable management elements of the cable management assembly may be 2, 3, 4, 5, 6, or more, such as 8, 9, or 10. Preferably, the number of the cable management elements is equal to or greater than 3, especially equal to or greater than 5.

According to a second aspect of the present invention, a cable manager is provided. The cable manager comprises: a cable management assembly for a cable manager according to the first aspect; and a support, wherein the cable management assembly is mounted to the support.

BRIEF DESCRIPTION OF THE DRAWINGS

Next, the present invention will be illustrated in more detail by way of embodiments with reference to the accompanying drawings. The schematic drawings are briefly described as follows.

DETAILED DESCRIPTION

The present invention will be described below with reference to the accompanying drawings. The accompanying drawings show embodiments of the present invention. It should be understood, however, that the present invention may be presented in multiple different ways, and not limited to the embodiments described below. In fact, the embodiments described hereinafter are intended to make a more complete disclosure of the present invention and to adequately help a person skilled in the art to understand the protection scope of the present invention. It should also be understood that, the embodiments disclosed herein can be combined in various ways to provide more additional embodiments.

It should be understood that, the wording in the specification is only used for describing particular embodiments and is not intended to limit the present invention. All the terms used in the specification, have the meanings as normally understood by a person skilled in the art, unless otherwise defined. For the sake of conciseness and clarity, the well-known functions or constructions may not be described in detail any longer. The wordings "comprising", "containing" and "including" used in the specification indicate the presence of the claimed features, but do not repel the presence of one or more other features.

The present invention provides a cable management assembly for a cable manager. The cable management assembly for a cable manager may be assembled in an electrical or electronic device for managing cables in the electrical or electronic device. The electrical or electronic device may be a telecommunication device. The cables may be electric cables, such as copper-based telecommunication cables provided with an RJ type plug; or may be optical cables, such as optical cables having to an LC, SC, and/or MPO connector(s).

Figure 1:
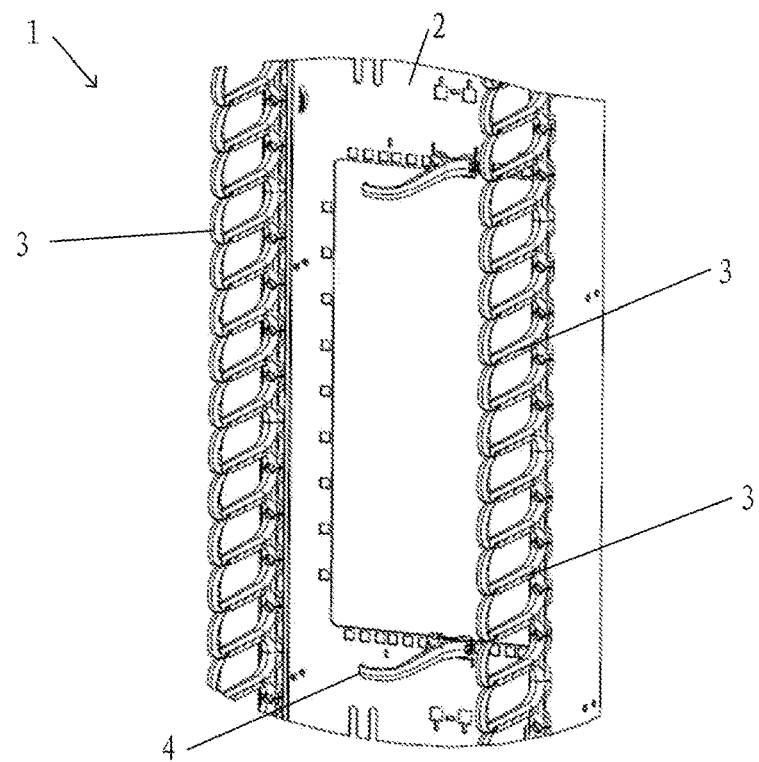
FIG. 1 is a partial perspective view of a cable manager comprising cable management assemblies according to an embodiment of the present invention.
Figure 2:
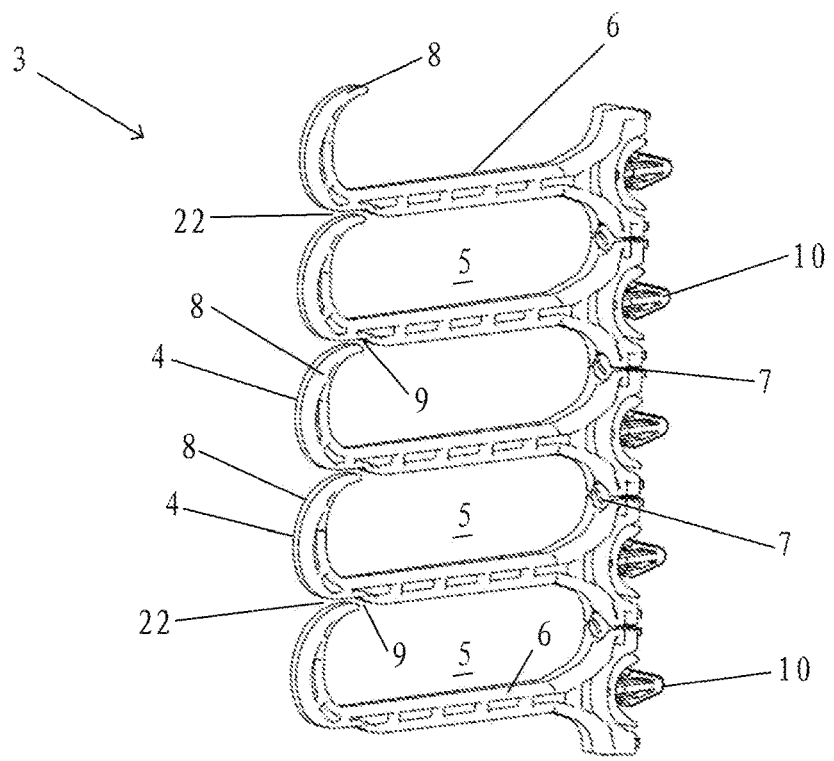
FIG. 2 is a perspective view of one of the cable management assemblies of FIG. 1.

FIG. 1 shows a partial perspective view of a cable manager comprising a plurality of cable management assemblies according to an embodiment of the present invention; and FIG. 2 is a perspective view of one of the cable management assemblies of FIG. 1.

As shown in FIG. 1, the cable manager 1 may include a support 2 and a plurality of cable management assemblies 3. The cable management assemblies 3 are mounted to the support 2. The support 2 may be a rack of a telecommunication device, or may be a plug board or any other object that can be used for receiving a cable management assembly.

The cable management assembly 3 comprises a plurality of cable management elements 4 arranged sequentially. FIG. 2 exemplarily shows five cable management elements 4, each of which forms a cable receiving portion 5. The cables not shown may be guided and restricted in the respective cable receiving portions 5. However, it may be understood that, it isn't necessary that all the cable management elements 4 form respectively a cable receiving portion 5. For example, a central cable management element may be constructed differently from the other cable management elements. For example, it is possible that the central one includes a rod section but not a hook portion, and even moreover, the rod section thereof may have a reduced length. For the sake of overall generality of the accompany drawings, for a plurality of the same or similar members, only some of them may be provided with reference signs. For example, in FIG. 2, only two of the cable management elements 4 and three of the cable receiving portions 5 are provided with reference signs.

Figure 3:
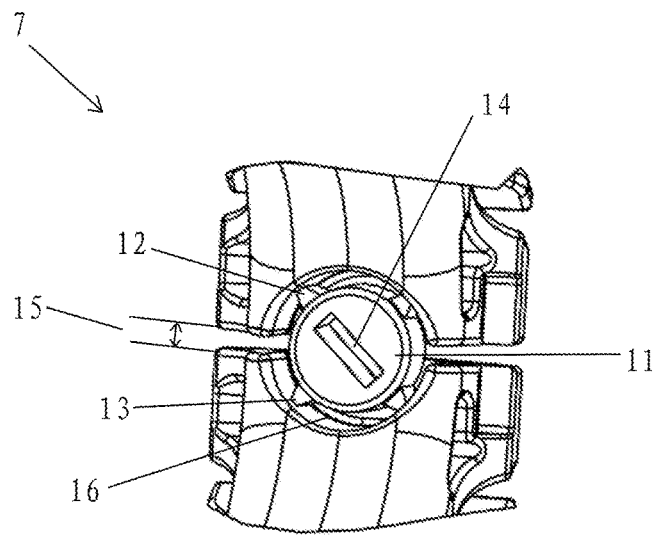
FIG. 3 is a partial perspective view of the cable management assembly of FIG. 2 in an area of a weak portion.

As shown in FIG. 2, every two adjacent cable management elements 4 may be connected to each other through a weak portion 7. FIG. 3 is a partial perspective view of the cable management assembly 3 of FIG. 2 in an area of the weak portion 7, where the connection realized by the weak portion 7 may be seen more explicitly. The weak portion 7 may be broken by rotating the weak portion, so that the two adjacent cable management elements 4 may be separated from each other. In this way, the user can treat the two management elements 4 separately. For example, it is possible to remove one of the two management elements 4 from the cable manager 1, or to change a mounting position of this cable management element 4 on the support 2. Therefore, the user can flexibly adjust the arrangement manner of each cable management element 4 on the support 2 according to actual needs. As schematically shown in FIG. 1, two separate cable management elements 4 that have been removed may be mounted on a back plate as the support 2. In some embodiments not shown, at least one connection realized by the weak portion may be replaced by a permanently non-detachable connection.

As shown in FIG. 3, the weak portion 7 may include a body 11, two first tabs 12, and two second tabs 13. The body 11 may be constructed as a columnar body. The body 11 is connected to one of the two adjacent cable management elements 4 through the first tabs 12, and to the other of the two adjacent cable management elements 4 through the second tabs 13. At least one of the first tabs 12 and the second tabs 13 may be disconnected by rotating the body 11. In an example, the first tabs 12 and the second tabs 13 may be both disconnected by rotating the body 11.

In order to facilitate the user to break the weak portion 7, a gap 16 may be formed between the body 11 and the two adjacent cable management elements 4. The first tabs 12 and the second tabs 13 are disposed in the gap. The two first tabs 12 and the two second tabs 13 may be disposed in the gap 16 uniformly in a circumferential direction of the body 11. In addition, the two adjacent cable management elements 4 may be spaced apart from each other by a distance 15 at their ends facing towards each other.

The body 11 may be provided with a groove 16 which is configured to receive a screwing tool. Thereby, the weak portion 7 may be rotated by means of a screwing tool. As shown in FIG. 3, the groove 16 may be constructed as a straight groove. Correspondingly, the screwing tool may be a screwdriver having a straight bit. In some embodiments not shown, the groove 16 may be constructed as a cross-shaped groove, or the groove may be constructed as an inner polygon.

Figure 4:
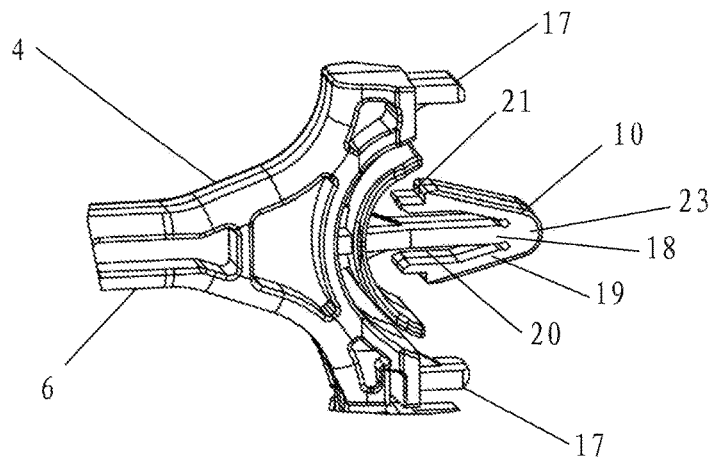
FIG. 4 is a partial perspective view of the cable management assembly of FIG. 2 for illustrating a mounting structure.

As shown in FIG. 2, the cable management assembly has a mounting structure 10, and in particular each cable management element 4 may have the mounting structure 10. However, it may be understood that only a part of the cable management elements 4 may have the mounting structure 10. By means of the mounting structure, the cable management assembly 3 may be mounted on the support 2. FIG. 4 is a partial perspective view of the cable management assembly of FIG. 2 for illustrating the mounting structure.

As shown in FIG. 4, the mounting structure 10 may include a snap-fit element 23. By means of the snap-fit element 23, the cable management element 4 having the snap-fit element may be detachably connected to the support 2. In this way, the cable management element 4 with the snap-fit element 23, which is separated from the cable management assembly 3, may be reused, so that the cost can be saved.

As shown in FIG. 4, the snap-fit element 23 may, for example, be constructed as an arrow-shaped structure. Specifically, the arrow-shaped structure includes a support rod 18 and angular tabs 19 provided on the support rod. There is a gap 20 between the support rod 18 and the angular tabs 19. The angular tabs 19 are elastically formed, and steps 21 are formed on both ends of the angular tabs 19. Correspondingly, a receiving groove for receiving the arrow-shaped structure is formed in the support 2. The receiving groove is constructed such that the arrow-shaped structure can be inserted into the receiving groove and is pre-tensioned in the receiving groove and abuts against the support 2 by the steps 21 (see FIG. 5). If it is necessary to release the snap-fit connection between the cable management element 4 and the support 2, the arrow-shaped structure may be disengaged from the receiving groove in such a manner as to press the angular tabs 19.

As shown in FIG. 4, the mounting structure 10 may include a positioning element 17. The positioning element 17 is configured to position the cable management element 4 relative to the support 2. The positioning element 17 may be a positioning pin. The positioning element 17 may be two positioning pins, which are respectively disposed on two sides of the snap-fit element 23. By cooperating the snap-fit element 23 with the positioning element 17, the cable management element 4 can be detachably mounted on the support 2 in a torsion-resistant manner.

Figure 5:
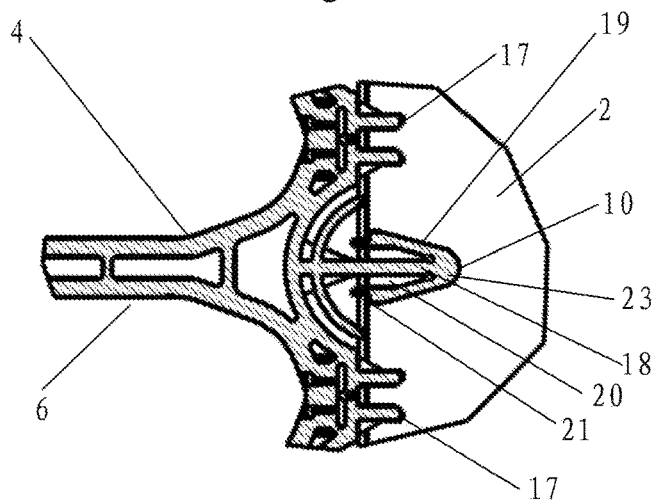
FIG. 5 is a schematic view of a mounting structure according to another embodiment.

FIG. 5 is a schematic view of a mounting structure according to another embodiment. The embodiment shown in FIG. 5 is different from that shown in FIG. 4 in that two positioning pins are respectively provided on each side of the snap-fit element 23.

In some embodiments not shown, the snap-fit element 23 and the positioning pin 17 may be separately provided on different cable management elements 4. For example, it is possible that one of the two adjacent cable management elements 4 is provided with the snap-fit element 23 only, and the other of the two adjacent cable management elements 4 is provided with the positioning pin 17 only.

As shown in FIG. 2, each cable management element 4 may be constructed as a finger, which includes a base portion, a rod section 6 and a hook portion 8, wherein the rod section projects from the base portion, and the hook portion is located at an end of the rod section facing away from the base. The mounting structure 10 may be disposed at least partially in an area of the base portion. The hook portion 8 of the finger may be made from a flexible material. By a flexible design of the hook portion 8, it is possible to facilitate the entry and exit of the cables relative to the cable receiving portion 5. A recess 9 may be formed on the back of the finger, and the free end of another finger adjacent to the finger on the back of the finger may extend into the area of the recess 9. In this way, it is possible to prevent the cables from unintentionally sliding out of the respective cable receiving portions 5.

It is also possible that at least one or even all of the fingers may be constructed to be substantially rigid. In some cases, the finger may be slightly elastic.

In the embodiment shown, each cable management element 4 is integrated. However, it is also conceivable that the cable management element may be multi-piece. For example, the base portion is a member and the rod section and the hook part are another member. The two members may be detachably connected to each other, such as in a snap-fit connection, or threaded connection.

Although the exemplary embodiments of the present invention have been described above, a person skilled in the art should understand that, he can make multiple changes and modifications to the exemplary embodiments of the present invention without departing from the spirit and scope of the present invention. All the changes and modifications are encompassed within the protection scope of the present invention.

What is claimed is:

1. A cable management assembly for a cable manager, comprising:
   a plurality of cable management elements arranged sequentially, at least one of which forms a cable receiving portion, in which two adjacent cable management elements are connected to each other through a weak portion;
   wherein the weak portion includes a body; and
   wherein the weak portion is breakable by rotating the body, so that the two adjacent cable management elements are separated from each other.

2. The cable management assembly according to claim 1, wherein the weak portion further includes at least one tab, wherein the body is connected to the two adjacent cable management elements through the at least one tab, and the connection is at least partially releasable by rotating the body.

3. The cable management assembly according to claim 2, wherein the weak portion includes a first tab and a second tab, wherein the body is connected to one of the two adjacent cable management elements through the first tab, and to the other of the two adjacent cable management elements through the second tab, and at least one of the first tab and the second tab is disconnectable by rotating the body.

4. The cable management assembly according to claim 3, wherein there is a gap between the body and the two adjacent cable management elements, wherein the first tab and the second tab are disposed in the gap.

5. The cable management assembly according to claim 4, wherein two first tabs and two second tabs are provided in the gap.

6. The cable management assembly according to claim 2, wherein the body is constructed as a columnar body.

7. The cable management assembly according to claim 2, wherein the body is provided with a groove configured to receive a screwing tool.

8. The cable management assembly according to claim 7, wherein the groove is constructed as a straight or cross-shaped groove, or as an inner hexagon.

9. The cable management assembly according to claim 1, wherein the two adjacent cable management elements are spaced apart from each other by a distance at their ends facing towards each other.

10. The cable management assembly according to claim 1, wherein every two adjacent cable management elements are connected to each other through the weak portion.

11. The cable management assembly according to claim 1, wherein each cable management element forms the cable receiving portion.

12. The cable management assembly according to claim 1, further comprising a support, wherein at least one of the plurality of cable management elements has a mounting structure, wherein the cable management assembly is mounted to the support.

13. The cable management assembly according to claim 12, wherein each of the cable management elements has the mounting structure.

14. The cable management assembly according to claim 12, wherein the mounting structure includes a snap-fit element and/or a positioning element.

15. The cable management assembly according to claim 1, wherein each of the cable management elements is constructed as a finger.

16. The cable management assembly according to claim 15, wherein the finger includes a rod section and a hook portion.

17. The cable management assembly according to claim 16, wherein a recess is formed on the back of the finger, and a free end of another finger extends into the area of the recess.

18. The cable management assembly according to claim 16, wherein the hook portion of the finger is made from a flexible material.

19. The cable management assembly according to claim 1, wherein the cable management assembly is integrally injection molded.

20. The cable management assembly according to claim 1, wherein the number of the cable management elements is at least 3.

21. A cable manager comprising:
a support, comprising a cable management assembly for a cable manager according to claim 1, wherein the cable management assembly is mounted to the support.

22. A cable management assembly comprising:
a first curved finger;
a second curved finger arranged adjacent to the first curved finger; and
a fastener arranged in between the first curved finger and the second curved finger;
wherein the fastener includes:
a rotatable body; and
a first tab;
wherein the first tab engages at least one of the first curved finger and the second curved finger when the rotatable body is in a first position; and
wherein the first tab disengages the at least one of the first curved finger and the second curved finger when the rotatable body is rotated to a second position.

23. The cable management assembly of claim 22, wherein the fastener further includes a second tab, wherein the first tab engages the first curved finger and the second tab engages the second curved finger when the rotatable body is rotated to the first position.

24. The cable management assembly of claim 23, wherein the first tab disengages the first curved finger and the second tab disengages the second curved finger when the rotatable body is rotated to the second position.

25. The cable management assembly of claim 22, wherein the rotatable body is a columnar body.

26. The cable management assembly of claim 22, wherein the first curved finger includes a finger portion that extends from a first side and a mounting portion arranged on a second side opposite the first side; and wherein the mounting portion includes at least one protrusion.

27. The cable management assembly of claim 26, wherein the mounting portion includes a first protrusion, a second protrusion, and a third protrusion, wherein the third protrusion comprises an engagement feature.

28. A cable manager comprising:
the cable management assembly of claim 27; and
a support;
wherein the engagement feature connects the first curved finger to the support.

* * * * *